United States Patent
Ferrara et al.

(10) Patent No.: US 12,199,401 B1
(45) Date of Patent: Jan. 14, 2025

(54) LIDAR SENSOR SYSTEM FOR VEHICLES INCLUDING INTEGRATED LIDAR CHIP

(71) Applicant: Aurora Operations, Inc., Mountain View, CA (US)

(72) Inventors: James Ferrara, Oakland, CA (US); Pruthvi Jujjavarapu, Palo Alto, CA (US); Sen Lin, Mountain View, CA (US); Xue Liu, San Jose, CA (US); Andrew Steil Michaels, Los Altos, CA (US); Parth Panchal, San Jose, CA (US); Zhizhong Tang, Palo Alto, CA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 0 days.

(21) Appl. No.: 18/511,387

(22) Filed: Nov. 16, 2023

(51) Int. Cl.
*G01S 17/88* (2006.01)
*G02B 6/122* (2006.01)
*H01S 5/00* (2006.01)
*G02B 6/12* (2006.01)

(52) U.S. Cl.
CPC ............ *H01S 5/0014* (2013.01); *G01S 17/88* (2013.01); *G02B 6/1225* (2013.01); *G02B 2006/12121* (2013.01); *H01S 2301/17* (2013.01)

(58) Field of Classification Search
CPC .... H01S 5/0014; H01S 2301/17; G01S 17/88; G02B 6/1225; G02B 2006/12121
See application file for complete search history.

(56) References Cited

U.S. PATENT DOCUMENTS

| | | | |
|---|---|---|---|
| 6,611,635 B1* | 8/2003 | Yoshimura | H01L 24/96 257/E25.032 |
| 10,684,419 B2* | 6/2020 | Fortusini | G02B 6/13 |
| 2003/0103712 A1* | 6/2003 | Glebov | G02B 6/12004 385/14 |
| 2012/0153447 A1* | 6/2012 | Jiang | H01L 21/76885 257/673 |
| 2014/0355929 A1* | 12/2014 | Tseng | G02B 6/136 438/31 |
| 2020/0280173 A1* | 9/2020 | Gao | H01S 5/02415 |
| 2021/0044748 A1* | 2/2021 | Hu | G02B 1/002 |
| 2022/0113565 A1* | 4/2022 | Buchbinder | H01S 5/026 |
| 2023/0040355 A1* | 2/2023 | Luff | G01S 7/4813 |

* cited by examiner

*Primary Examiner* — Xinning(Tom) Niu
(74) *Attorney, Agent, or Firm* — Dority & Manning, P.A.

(57) ABSTRACT

A LIDAR sensor system for a vehicle includes a silicon photonics substrate. The silicon photonics substrate includes: a semiconductor wafer; one or more surface features on a first surface of the semiconductor wafer; and a photoresist layer formed on the first surface of the semiconductor wafer, wherein the photoresist layer includes a laminated dry film. The silicon photonics substrate can be manufactured by obtaining a semiconductor wafer having one or more surface features; applying a dry film photoresist layer to a first surface of the semiconductor wafer; performing an adhesion bake process on the semiconductor wafer; developing the dry film photoresist layer to produce one or more developed regions in the dry film photoresist layer; and forming one or more solder bumps in the one or more developed regions.

16 Claims, 7 Drawing Sheets

LIDAR SENSOR SYSTEM FOR VEHICLES INCLUDING INTEGRATED LIDAR CHIP

BACKGROUND

Light Detection and Ranging (LIDAR) systems use lasers to create three-dimensional representations of surrounding environments. A LIDAR system includes at least one emitter paired with a receiver to form a channel, though an array of channels may be used to expand the field of view of the LIDAR system. During operation, each channel emits a laser beam into the environment. The laser beam reflects off of an object within the surrounding environment, and the reflected laser beam is detected by the receiver. A single channel provides a single point of ranging information. Collectively, channels are combined to create a point cloud that corresponds to a three-dimensional representation of the surrounding environment.

SUMMARY

Aspects and advantages of implementations of the present disclosure will be set forth in part in the following description, or may be learned from the description, or may be learned through practice of the implementations.

Example aspects of the present disclosure are directed to LIDAR systems. As further described herein, the LIDAR systems can be used by various devices and platforms (e.g., robotic platforms, etc.) to improve the ability of the devices and platforms to perceive their environment and perform functions in response thereto (e.g., autonomously navigating through the environment).

The present disclosure is directed to LIDAR systems for use with, for example, vehicles. A LIDAR system according to example aspects of the present disclosure includes a LIDAR module that includes an emitter configured to emit a light beam. The LIDAR module includes an optic device configured to split the light beam into a plurality of light beams. The LIDAR module includes an optical amplifier array configured to amplify the plurality of light beams to generate a plurality of amplified light beams. For instance, the optical power of the amplified light beams can, in some implementations, range from 10 decibels greater than an optical power of the plurality of light beams to 30 decibels greater than the optical power of the plurality of light beams. The LIDAR module includes a transceiver configured to facilitate transmitting the plurality of amplified light beams into a surrounding environment. The transceiver is further configured to receive return light beams from the surrounding environment that can be combined to generate point cloud data representative of objects in the surrounding environment.

An integrated LIDAR system typically consists of complex circuits of photonic elements. LIDAR system electronics, such as silicon photonics dies, can be bonded to other components of the LIDAR system, such as a packaging substrate, using "flip chip" bonding. As opposed to techniques such as wire bonding, where one or more conducting wires are attached between signal contacts on one or more dies, in a flip chip configuration all of the signal contacts between a die and a substrate (or a first die and a second die) are respectively located on a single surface of each component. The surfaces of the die or the substrate having the signal contacts include one or more flip chip bumps. When the surfaces of the die and the substrate having the signal contacts are mated, typically under pressure, heat, or some other bonding force, the flip chip bumps can form one or more flip chip bump bonds between the die and the substrate to couple the die to the substrate. Flip chip bonding can provide improved form factor, electronics density, performance and/or operational parameters as well as reduced cost compared to some other solutions such as wire bonding.

One existing approach to flip chip bonding, especially for common semiconductor integrated circuit wafers, is to perform under bump metallization (UBM) deposition on the entire surface of the wafer, followed by coating the surface with a liquid photoresist. The surface is then exposed to a bake process and a mask-selective photoresist exposure and development process. The developed area is then plated with solder. Once the plating is finished, the photoresist is stripped, and the UBM is etched away. However, wafers having nonuniform or irregular surfaces can suffer defects with this approach. For instance, many LIDAR system electronics, such as silicon photonics wafers or dies used for manufacturing silicon photonics chips, may have one or more features on the surface that is flip chip bonded. The features can be, for example, etch features that are etched into the surface that is flip chip bonded. For instance, the wafer may have one or more trench features etched in the surface that is flip chip bonded. The trench features can be used, for example, for optical butt-coupling purposes. As another example, the features can be or can include one or more undercut features. The undercut features can form a cavity underneath the surface of the wafer. The undercut features can be used, for example, for waveguide model size control purposes.

When the surface of the wafer having the irregular features is exposed to some existing flip chip bump formation processes, the irregular features may trap air and/or other contaminants that can cause damage to the wafer during subsequent manufacturing processes. For example, air can be trapped inside the irregular features when the surface is coated with a liquid photoresist. During manufacturing process steps that expose the wafer to temperature changes, such as the bake process, the air and/or other volatile material from the liquid photoresist can undergo volume expansion. The volume expansion of the air underneath the liquid photoresist can cause damage to the photoresist and/or wafer, such as by damaging the structural integrity of the photoresist layer, causing delamination of the photoresist, causing damage or breakage of structures of the wafer (e.g., undercut features), causing air bubbles underneath the photoresist, and so on. This damage can prevent the wafer from being fit for subsequent processing steps, such as the solder plating process. In some cases, the wafer must be discarded due to this photoresist damage.

According to the present disclosure, however, the wafer can be laminated with a dry film photoresist. A dry film photoresist can be a photoresist in a form (e.g., a tape) that can be readily laminated onto a surface of the wafer. After lamination, the wafer including the dry film photoresist can be exposed to an adhesion bake process. During the adhesion bake process, the wafer including the dry film photoresist can be exposed to an adhesion bake temperature to improve adhesion of the dry film photoresist to the surface of the wafer. The dry film photoresist can additionally have a smaller amount of volatile material than a conventional liquid photoresist. Because of the smaller amount of volatile material, the baking process of the dry film photoresist can have a reduced incidence of photoresist damage. After the adhesion bake process, the wafer including the dry film photoresist can be subjected to one or more subsequent process steps to form flip chip bump bonds on the surface of the wafer. The subsequent process steps can include a mask-selective photoresist exposure and development process step, a solder plating process step, a photoresist strip process step, an under bump metallization etch process step, and/or a reflow process step.

The systems and methods according to the present disclosure can provide a number of technical effects and benefits. As one example, an autonomous vehicle or autonomous vehicle control system including the wafer having the dry film photoresist can have reduced occurrence of breakage or damage to surface features of the wafer. The reduced occurrence of breakage or damage to the surface features can improve the integrity of the photonic and/or electric circuits formed on the wafer. For instance, the wafer can become more durable and robust to movement, temperature changes, and other environmental factors resulting from the wafer's inclusion onboard an autonomous vehicle. This can be especially beneficial for reducing surface feature fractures that may not be easily detectable during testing and may only present after the wafer has been subjected to rigorous operation onboard an autonomous vehicle.

For example, in an aspect, the present disclosure provides for a LIDAR sensor system for a vehicle. The LIDAR sensor system includes a silicon photonics substrate that includes: a semiconductor wafer; one or more surface features on a first surface of the semiconductor wafer; and a photoresist layer formed on the first surface of the semiconductor wafer, where the photoresist layer includes a laminated dry film.

In some implementations, the LIDAR sensor system further includes one or more developed regions in the laminated dry film of the photoresist layer and one or more solder bumps formed in the one or more developed regions wherein the one or more solder bonds are configured to bond to a second substrate of the LIDAR sensor system in a flip chip configuration.

In some implementations, the one or more surface features include one or more trench features and one or more undercut features.

For example, in an aspect, the present disclosure provides for a LIDAR photonics substrate for a LIDAR sensor system for a vehicle. The LIDAR photonics substrate includes: a semiconductor wafer; one or more surface features on a first surface of the semiconductor wafer; and a photoresist layer formed on the first surface of the semiconductor wafer, where the photoresist layer includes a laminated dry film.

In some implementations, the LIDAR photonics substrate further includes one or more developed regions in the laminated dry film of the photoresist layer.

In some implementations, the LIDAR photonics substrate further includes one or more solder bumps formed in the one or more developed regions, wherein the one or more solder bonds are configured to bond to a substrate of a LIDAR sensor system in a flip chip configuration.

In some implementations, the LIDAR photonics substrate further includes an under bump metallization (UBM) layer on the first surface of the semiconductor wafer.

In some implementations, the LIDAR photonics substrate further includes a second surface opposite the first surface, where no signal contacts are disposed on the second surface.

In some implementations, the one or more surface features include one or more trench features and one or more undercut features.

In some implementations, one or more waveguides are formed on the first surface of the semiconductor wafer.

In some implementations, the semiconductor wafer is a silicon photonics wafer.

In some implementations, the laminated dry film of the photoresist layer is or includes a photoresist tape.

In some implementations, the substrate is incorporated into a LIDAR sensor system.

For example, in an aspect, the present disclosure provides for a method of manufacturing a semiconductor wafer for a LIDAR sensor system. The method includes: obtaining a semiconductor wafer having one or more surface features; applying a dry film photoresist layer to a first surface of the semiconductor wafer; performing an adhesion bake process on the semiconductor wafer; developing the dry film photoresist layer to produce one or more developed regions in the dry film photoresist layer; and forming one or more solder bumps in the one or more developed regions.

In some implementations, the method further includes performing an under bump metallization (UBM) process on the first surface of the semiconductor wafer.

In some implementations, the method further includes removing the dry film photoresist layer.

In some implementations, the method further includes bonding the semiconductor wafer to a substrate of a LIDAR sensor system.

In some implementations the one or more surface features include one or more trench features or one or more undercut features.

In some implementations, the adhesion bake process includes heating the semiconductor wafer to an adhesion bake temperature, the adhesion bake temperature being a temperature between about 50 degrees Celsius and about 150 degrees Celsius.

In some implementations, developing the dry film photoresist layer includes selectively exposing the dry film photoresist layer through a patterned mask.

Other example aspects of the present disclosure are directed to other systems, methods, vehicles, apparatuses, tangible non-transitory computer-readable media, and devices for motion prediction and/or operation of a device including a LIDAR system having a LIDAR module according to example aspects of the present disclosure.

These and other features, aspects and advantages of various implementations of the present disclosure will become better understood with reference to the following description and appended claims. The accompanying drawings, which are incorporated in and constitute a part of this specification, illustrate implementations of the present disclosure and, together with the description, serve to explain the related principles.

DETAILED DESCRIPTION

The following describes the technology of this disclosure within the context of an autonomous vehicle for example purposes only. As described herein, the technology is not limited to an autonomous vehicle and can be implemented within other robotic and computing systems as well as various devices. For example, the systems and methods disclosed herein can be implemented in a variety of ways including, but not limited to, a computer-implemented method, an autonomous vehicle system, an autonomous vehicle control system, a robotic platform system, a general robotic device control system, a computing device, etc.

Figure 1:
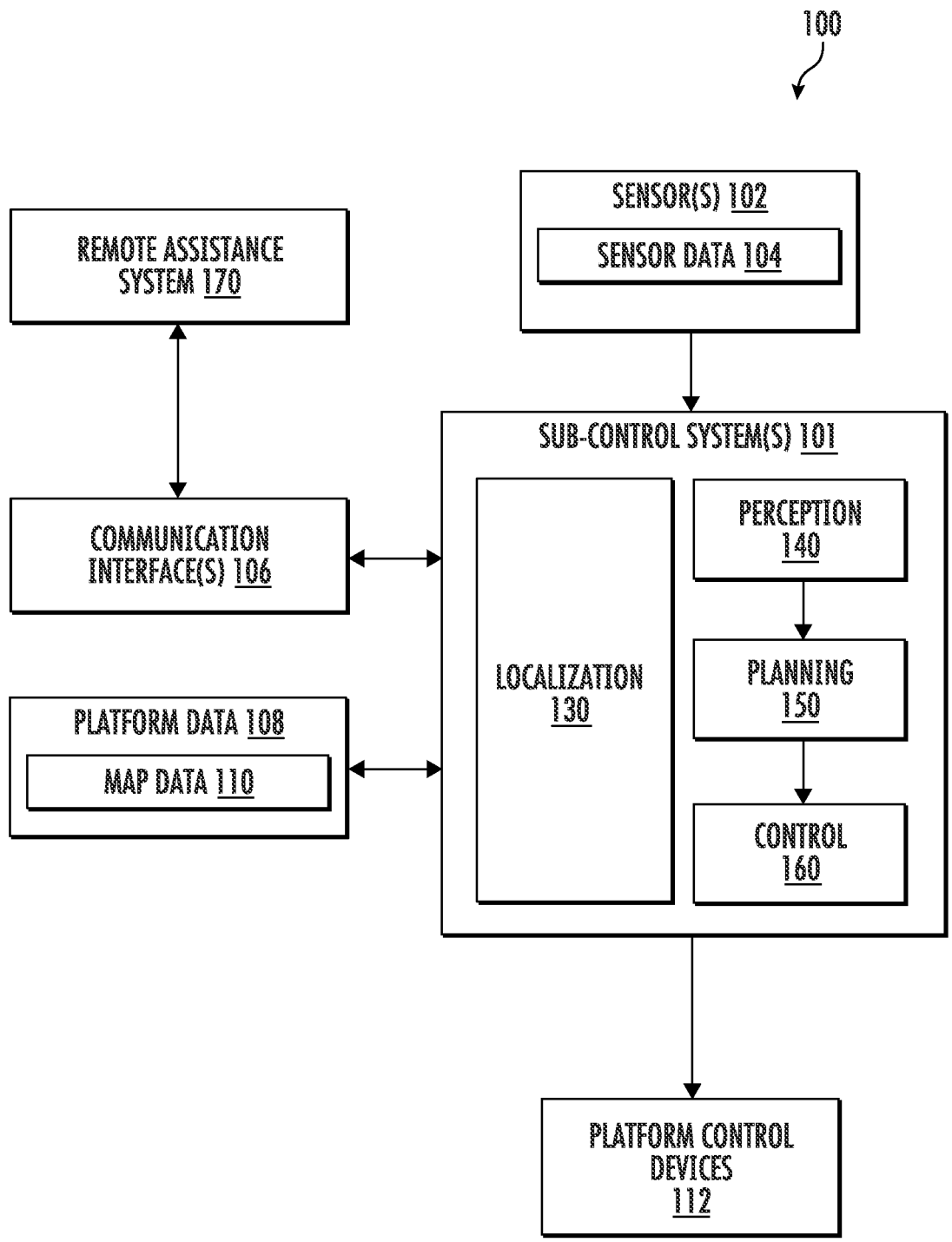
FIG. 1 depicts a block diagram of an example system according to some implementations of the present disclosure.

With reference to FIGS. 1-9, example implementations of the present disclosure are discussed in further detail. FIG. 1 depicts a block diagram of an example autonomous vehicle control system 100 for an autonomous vehicle according to some implementations of the present disclosure. The autonomous vehicle control system 100 can be implemented by a computing system of an autonomous vehicle). The autonomous vehicle control system 100 can include one or more sub-control systems 101 that operate to obtain inputs from sensor(s) 102 or other input devices of the autonomous vehicle control system 100. In some implementations, the sub-control system(s) 101 can additionally obtain platform data 108 (e.g., map data 110) from local or remote storage. The sub-control system(s) 101 can generate control outputs for controlling the autonomous vehicle (e.g., through platform control devices 112, etc.) based on sensor data 104, map data 110, or other data. The sub-control system 101 may include different subsystems for performing various autonomy operations. The subsystems may include a localization system 130, a perception system 140, a planning system 150, and a control system 160. The localization system 130 can determine the location of the autonomous vehicle within its environment; the perception system 140 can detect, classify, and track objects and actors in the environment; the planning system 150 can determine a trajectory for the autonomous vehicle; and the control system 160 can translate the trajectory into vehicle controls for controlling the autonomous vehicle. The sub-control system(s) 101 can be implemented by one or more onboard computing system(s). The subsystems can include one or more processors and one or more memory devices. The one or more memory devices can store instructions executable by the one or more processors to cause the one or more processors to perform operations or functions associated with the subsystems. The computing resources of the sub-control system(s) 101 can be shared among its subsystems, or a subsystem can have a set of dedicated computing resources.

In some implementations, the autonomous vehicle control system 100 can be implemented for or by an autonomous vehicle (e.g., a ground-based autonomous vehicle). The autonomous vehicle control system 100 can perform various processing techniques on inputs (e.g., the sensor data 104, the map data 110) to perceive and understand the vehicle's surrounding environment and generate an appropriate set of control outputs to implement a vehicle motion plan (e.g., including one or more trajectories) for traversing the vehicle's surrounding environment. In some implementations, an autonomous vehicle implementing the autonomous vehicle control system 100 can drive, navigate, operate, etc. with minimal or no interaction from a human operator (e.g., driver, pilot, etc.).

In some implementations, the autonomous vehicle can be configured to operate in a plurality of operating modes. For instance, the autonomous vehicle can be configured to operate in a fully autonomous (e.g., self-driving, etc.) operating mode in which the autonomous platform is controllable without user input (e.g., can drive and navigate with no input from a human operator present in the autonomous vehicle or remote from the autonomous vehicle, etc.). The autonomous vehicle can operate in a semi-autonomous operating mode in which the autonomous vehicle can operate with some input from a human operator present in the autonomous vehicle (or a human operator that is remote from the autonomous platform). In some implementations, the autonomous vehicle can enter into a manual operating mode in which the autonomous vehicle is fully controllable by a human operator (e.g., human driver, etc.) and can be prohibited or disabled (e.g., temporary, permanently, etc.) from performing autonomous navigation (e.g., autonomous driving, etc.). The autonomous vehicle can be configured to operate in other modes such as, for example, park or sleep modes (e.g., for use between tasks such as waiting to provide a trip/service, recharging, etc.). In some implementations, the autonomous vehicle can implement vehicle operating assistance technology (e.g., collision mitigation system, power assist steering, etc.), for example, to help assist the human operator of the autonomous platform (e.g., while in a manual mode, etc.).

The autonomous vehicle control system 100 can be located onboard (e.g., on or within) an autonomous vehicle and can be configured to operate the autonomous vehicle in various environments. The environment may be a real-world environment or a simulated environment. In some implementations, one or more simulation computing devices can simulate one or more of: the sensors 102, the sensor data 104, communication interface(s) 106, the platform data 108, or the platform control devices 112 for simulating operation of the autonomous vehicle control system 100.

In some implementations, the sub-control system(s) 101 can communicate with one or more networks or other systems with communication interface(s) 106. The communication interface(s) 106 can include any suitable components for interfacing with one or more network(s), including, for example, transmitters, receivers, ports, controllers, antennas, or other suitable components that can help facilitate communication. In some implementations, the communication interface(s) 106 can include a plurality of components (e.g., antennas, transmitters, or receivers, etc.) that allow it to implement and utilize various communication techniques (e.g., multiple-input, multiple-output (MIMO) technology, etc.).

In some implementations, the sub-control system(s) 101 can use the communication interface(s) 106 to communicate with one or more computing devices that are remote from the autonomous vehicle over one or more network(s). For instance, in some examples, one or more inputs, data, or functionalities of the sub-control system(s) 101 can be supplemented or substituted by a remote system communicating over the communication interface(s) 106. For instance, in some implementations, the map data 110 can be downloaded over a network to a remote system using the communication interface(s) 106. In some examples, one or more of the localization system 130, the perception system 140, the planning system 150, or the control system 160 can be updated, influenced, nudged, communicated with, etc. by a remote system for assistance, maintenance, situational response override, management, etc.

The sensor(s) 102 can be located onboard the autonomous platform. In some implementations, the sensor(s) 102 can include one or more types of sensor(s). For instance, one or more sensors can include image capturing device(s) (e.g., visible spectrum cameras, infrared cameras, etc.). Additionally or alternatively, the sensor(s) 102 can include one or more depth capturing device(s). For example, the sensor(s) 102 can include one or more LIDAR sensor(s) or Radio Detection and Ranging (RADAR) sensor(s). The sensor(s) 102 can be configured to generate point data descriptive of at least a portion of a three-hundred-and-sixty-degree view of the surrounding environment. The point data can be point cloud data (e.g., three-dimensional LIDAR point cloud data, RADAR point cloud data). In some implementations, one or more of the sensor(s) 102 for capturing depth information can be fixed to a rotational device in order to rotate the sensor(s) 102 about an axis. The sensor(s) 102 can be rotated about the axis while capturing data in interval sector packets descriptive of different portions of a three-hundred-and-sixty-degree view of a surrounding environment of the autonomous platform. In some implementations, one or more of the sensor(s) 102 for capturing depth information can be solid state.

The sensor(s) 102 can be configured to capture the sensor data 104 indicating or otherwise being associated with at least a portion of the environment of the autonomous vehicle. The sensor data 104 can include image data (e.g., 2D camera data, video data, etc.), RADAR data, LIDAR data (e.g., 3D point cloud data, etc.), audio data, or other types of data. In some implementations, the sub-control system(s) 101 can obtain input from additional types of sensors, such as inertial measurement units (IMUs), altimeters, inclinometers, odometry devices, location or positioning devices (e.g., GPS, compass), wheel encoders, or other types of sensors. In some implementations, the sub-control system(s) 101 can obtain sensor data 104 associated with particular component(s) or system(s) of the autonomous vehicle. This sensor data 104 can indicate, for example, wheel speed, component temperatures, steering angle, cargo or passenger status, etc. In some implementations, the sub-control system(s) 101 can obtain sensor data 104 associated with ambient conditions, such as environmental or weather conditions. In some implementations, the sensor data 104 can include multi-modal sensor data. The multi-modal sensor data can be obtained by at least two different types of sensor(s) (e.g., of the sensors 102) and can indicate static and/or dynamic object(s) or actor(s) within an environment of the autonomous vehicle. The multi-modal sensor data can include at least two types of sensor data (e.g., camera and LIDAR data). In some implementations, the autonomous vehicle can utilize the sensor data 104 for sensors that are remote from (e.g., offboard) the autonomous vehicle. This can include for example, sensor data 104 captured by a different autonomous vehicle.

The sub-control system(s) 101 can obtain the map data 110 associated with an environment in which the autonomous vehicle was, is, or will be located. The map data 110 can provide information about an environment or a geographic area. For example, the map data 110 can provide information regarding the identity and location of different travel ways (e.g., roadways, etc.), travel way segments (e.g., road segments, etc.), buildings, or other items or objects (e.g., lampposts, crosswalks, curbs, etc.); the location and directions of boundaries or boundary markings (e.g., the location and direction of traffic lanes, parking lanes, turning lanes, bicycle lanes, other lanes, etc.); traffic control data (e.g., the location and instructions of signage, traffic lights, other traffic control devices, etc.); obstruction information (e.g., temporary or permanent blockages, etc.); event data (e.g., road closures/traffic rule alterations due to parades, concerts, sporting events, etc.); nominal vehicle path data (e.g., indicating an ideal vehicle path such as along the center of a certain lane, etc.); or any other map data that provides information that assists an autonomous vehicle in understanding its surrounding environment and its relationship thereto. In some implementations, the map data 110 can include high-definition map information. Additionally or alternatively, the map data 110 can include sparse map data (e.g., lane graphs, etc.). In some implementations, the sensor data 104 can be fused with or used to update the map data 110 in real time.

The sub-control system(s) 101 can include the localization system 130, which can provide an autonomous vehicle with an understanding of its location and orientation in an environment. In some examples, the localization system 130 can support one or more other subsystems of the sub-control system(s) 101, such as by providing a unified local reference frame for performing, e.g., perception operations, planning operations, or control operations.

In some implementations, the localization system 130 can determine a current position of the autonomous vehicle. A current position can include a global position (e.g., respecting a georeferenced anchor, etc.) or relative position (e.g., respecting objects in the environment, etc.). The localization system 130 can generally include or interface with any device or circuitry for analyzing a position or change in position of an autonomous vehicle. For example, the localization system 130 can determine position by using one or more of: inertial sensors (e.g., inertial measurement unit(s), etc.), a satellite positioning system, radio receivers, networking devices (e.g., based on IP address, etc.), triangulation or proximity to network access points or other network components (e.g., cellular towers, Wi-Fi access points, etc.), or other suitable techniques. The position of the autonomous vehicle can be used by various subsystems of the sub-control system(s) 101 or provided to a remote computing system (e.g., using the communication interface(s) 106).

In some implementations, the localization system 130 can register relative positions of elements of a surrounding environment of the autonomous vehicle with recorded positions in the map data 110. For instance, the localization system 130 can process the sensor data 104 (e.g., LIDAR data, RADAR data, camera data, etc.) for aligning or otherwise registering to a map of the surrounding environment (e.g., from the map data 110) to understand the autonomous vehicle's position within that environment. Accordingly, in some implementations, the autonomous vehicle can identify its position within the surrounding environment (e.g., across six axes, etc.) based on a search over the map data 110. In some implementations, given an initial location, the localization system 130 can update the autonomous vehicle's location with incremental re-alignment based on recorded or estimated deviations from the initial location. In some implementations, a position can be registered directly within the map data 110.

In some implementations, the map data 110 can include a large volume of data subdivided into geographic tiles, such that a desired region of a map stored in the map data 110 can be reconstructed from one or more tiles. For instance, a plurality of tiles selected from the map data 110 can be stitched together by the sub-control system 101 based on a position obtained by the localization system 130 (e.g., a number of tiles selected in the vicinity of the position).

In some implementations, the localization system 130 can determine positions (e.g., relative or absolute) of one or more attachments or accessories for an autonomous vehicle. For instance, an autonomous vehicle can be associated with a cargo platform, and the localization system 130 can provide positions of one or more points on the cargo platform. For example, a cargo platform can include a trailer or other device towed or otherwise attached to or manipulated by an autonomous vehicle, and the localization system 130 can provide for data describing the position (e.g., absolute, relative, etc.) of the autonomous vehicle as well as the cargo platform. Such information can be obtained by the other autonomy systems to help operate the autonomous vehicle.

The sub-control system(s) 101 can include the perception system 140, which can allow an autonomous platform to detect, classify, and track objects and actors in its environment. Environmental features or objects perceived within an environment can be those within the field of view of the sensor(s) 102 or predicted to be occluded from the sensor(s) 102. This can include object(s) not in motion or not predicted to move (static objects) or object(s) in motion or predicted to be in motion (dynamic objects/actors).

The perception system 140 can determine one or more states (e.g., current or past state(s), etc.) of one or more objects that are within a surrounding environment of an autonomous vehicle. For example, state(s) can describe (e.g., for a given time, time period, etc.) an estimate of an object's current or past location (also referred to as position); current or past speed/velocity; current or past acceleration; current or past heading; current or past orientation; size/footprint (e.g., as represented by a bounding shape, object highlighting, etc.); classification (e.g., pedestrian class vs. vehicle class vs. bicycle class, etc.); the uncertainties associated therewith; or other state information. In some implementations, the perception system 140 can determine the state(s) using one or more algorithms or machine-learned models configured to identify/classify objects based on inputs from the sensor(s) 102. The perception system can use different modalities of the sensor data 104 to generate a representation of the environment to be processed by the one or more algorithms or machine-learned models. In some implementations, state(s) for one or more identified or unidentified objects can be maintained and updated over time as the autonomous vehicle continues to perceive or interact with the objects (e.g., maneuver with or around, yield to, etc.). In this manner, the perception system 140 can provide an understanding about a current state of an environment (e.g., including the objects therein, etc.) informed by a record of prior states of the environment (e.g., including movement histories for the objects therein). Such information can be helpful as the autonomous vehicle plans its motion through the environment.

The sub-control system(s) 101 can include the planning system 150, which can be configured to determine how the autonomous platform is to interact with and move within its environment. The planning system 150 can determine one or more motion plans for an autonomous platform. A motion plan can include one or more trajectories (e.g., motion trajectories) that indicate a path for an autonomous vehicle to follow. A trajectory can be of a certain length or time range. The length or time range can be defined by the computational planning horizon of the planning system 150. A motion trajectory can be defined by one or more waypoints (with associated coordinates). The waypoint(s) can be future location(s) for the autonomous platform. The motion plans can be continuously generated, updated, and considered by the planning system 150.

The planning system 150 can determine a strategy for the autonomous platform. A strategy may be a set of discrete decisions (e.g., yield to actor, reverse yield to actor, merge, lane change) that the autonomous platform makes. The strategy may be selected from a plurality of potential strategies. The selected strategy may be a lowest cost strategy as determined by one or more cost functions. The cost functions may, for example, evaluate the probability of a collision with another actor or object.

The planning system 150 can determine a desired trajectory for executing a strategy. For instance, the planning system 150 can obtain one or more trajectories for executing one or more strategies. The planning system 150 can evaluate trajectories or strategies (e.g., with scores, costs, rewards, constraints, etc.) and rank them. For instance, the planning system 150 can use forecasting output(s) that indicate interactions (e.g., proximity, intersections, etc.) between trajectories for the autonomous platform and one or more objects to inform the evaluation of candidate trajectories or strategies for the autonomous platform. In some implementations, the planning system 150 can utilize static cost(s) to evaluate trajectories for the autonomous platform (e.g., "avoid lane boundaries," "minimize jerk," etc.). Additionally or alternatively, the planning system 150 can utilize dynamic cost(s) to evaluate the trajectories or strategies for the autonomous platform based on forecasted outcomes for the current operational scenario (e.g., forecasted trajectories or strategies leading to interactions between actors, forecasted trajectories or strategies leading to interactions between actors and the autonomous platform, etc.). The planning system 150 can rank trajectories based on one or more static costs, one or more dynamic costs, or a combination thereof. The planning system 150 can select a motion plan (and a corresponding trajectory) based on a ranking of a plurality of candidate trajectories. In some implementations, the planning system 150 can select a highest ranked candidate, or a highest ranked feasible candidate.

The planning system 150 can then validate the selected trajectory against one or more constraints before the trajectory is executed by the autonomous platform.

To help with its motion planning decisions, the planning system 150 can be configured to perform a forecasting function. The planning system 150 can forecast future state(s) of the environment. This can include forecasting the future state(s) of other actors in the environment. In some implementations, the planning system 150 can forecast future state(s) based on current or past state(s) (e.g., as developed or maintained by the perception system 140). In some implementations, future state(s) can be or include forecasted trajectories (e.g., positions over time) of the objects in the environment, such as other actors. In some implementations, one or more of the future state(s) can include one or more probabilities associated therewith (e.g., marginal probabilities, conditional probabilities). For example, the one or more probabilities can include one or more probabilities conditioned on the strategy or trajectory options available to the autonomous vehicle. Additionally or alternatively, the probabilities can include probabilities conditioned on trajectory options available to one or more other actors.

To implement selected motion plan(s), the sub-control system(s) 101 can include a control system 160 (e.g., a vehicle control system). Generally, the control system 160 can provide an interface between the sub-control system(s) 101 and the platform control devices 112 for implementing the strategies and motion plan(s) generated by the planning system 150. For instance, the control system 160 can implement the selected motion plan/trajectory to control the autonomous platform's motion through its environment by following the selected trajectory (e.g., the waypoints included therein). The control system 160 can, for example, translate a motion plan into instructions for the appropriate platform control devices 112 (e.g., acceleration control, brake control, steering control, etc.). By way of example, the control system 160 can translate a selected motion plan into instructions to adjust a steering component (e.g., a steering angle) by a certain number of degrees, apply a certain magnitude of braking force, increase/decrease speed, etc. In some implementations, the control system 160 can communicate with the platform control devices 112 through communication channels including, for example, one or more data buses (e.g., controller area network (CAN), etc.), onboard diagnostics connectors (e.g., OBD-II, etc.), or a combination of wired or wireless communication links. The platform control devices 112 can send or obtain data, messages, signals, etc. to or from the sub-control system(s) 101 (or vice versa) through the communication channel(s).

The sub-control system(s) 101 can receive, through communication interface(s) 106, assistive signal(s) from remote assistance system 170. Remote assistance system 170 can communicate with the sub-control system(s) 101 over a network. In some implementations, the sub-control system(s) 101 can initiate a communication session with the remote assistance system 170. For example, the sub-control system(s) 101 can initiate a session based on or in response to a trigger. In some implementations, the trigger may be an alert, an error signal, a map feature, a request, a location, a traffic condition, a road condition, etc.

After initiating the session, the sub-control system(s) 101 can provide context data to the remote assistance system 170. The context data may include sensor data 104 and state data of the autonomous vehicle. For example, the context data may include a live camera feed from a camera of the autonomous vehicle and the autonomous vehicle's current speed. An operator (e.g., human operator) of the remote assistance system 170 can use the context data to select assistive signals. The assistive signal(s) can provide values or adjustments for various operational parameters or characteristics for the sub-control system(s) 101. For instance, the assistive signal(s) can include way points (e.g., a path around an obstacle, lane change, etc.), velocity or acceleration profiles (e.g., speed limits, etc.), relative motion instructions (e.g., convoy formation, etc.), operational characteristics (e.g., use of auxiliary systems, reduced energy processing modes, etc.), or other signals to assist the sub-control system(s) 101.

The sub-control system(s) 101 can use the assistive signal(s) for input into one or more autonomy subsystems for performing autonomy functions. For instance, the planning system 150 can receive the assistive signal(s) as an input for generating a motion plan. For example, assistive signal(s) can include constraints for generating a motion plan. Additionally or alternatively, assistive signal(s) can include cost or reward adjustments for influencing motion planning by the planning system 150. Additionally or alternatively, assistive signal(s) can be considered by the sub-control system(s) 101 as suggestive inputs for consideration in addition to other received data (e.g., sensor inputs, etc.).

The sub-control system(s) 101 may be platform agnostic, and the control system 160 can provide control instructions to platform control devices 112 for a variety of different platforms for autonomous movement (e.g., a plurality of different autonomous platforms fitted with autonomous control systems). This can include a variety of different types of autonomous vehicles (e.g., sedans, vans, SUVs, trucks, electric vehicles, combustion power vehicles, etc.) from a variety of different manufacturers/developers that operate in various different environments and, in some implementations, perform one or more vehicle services.

Figure 2:
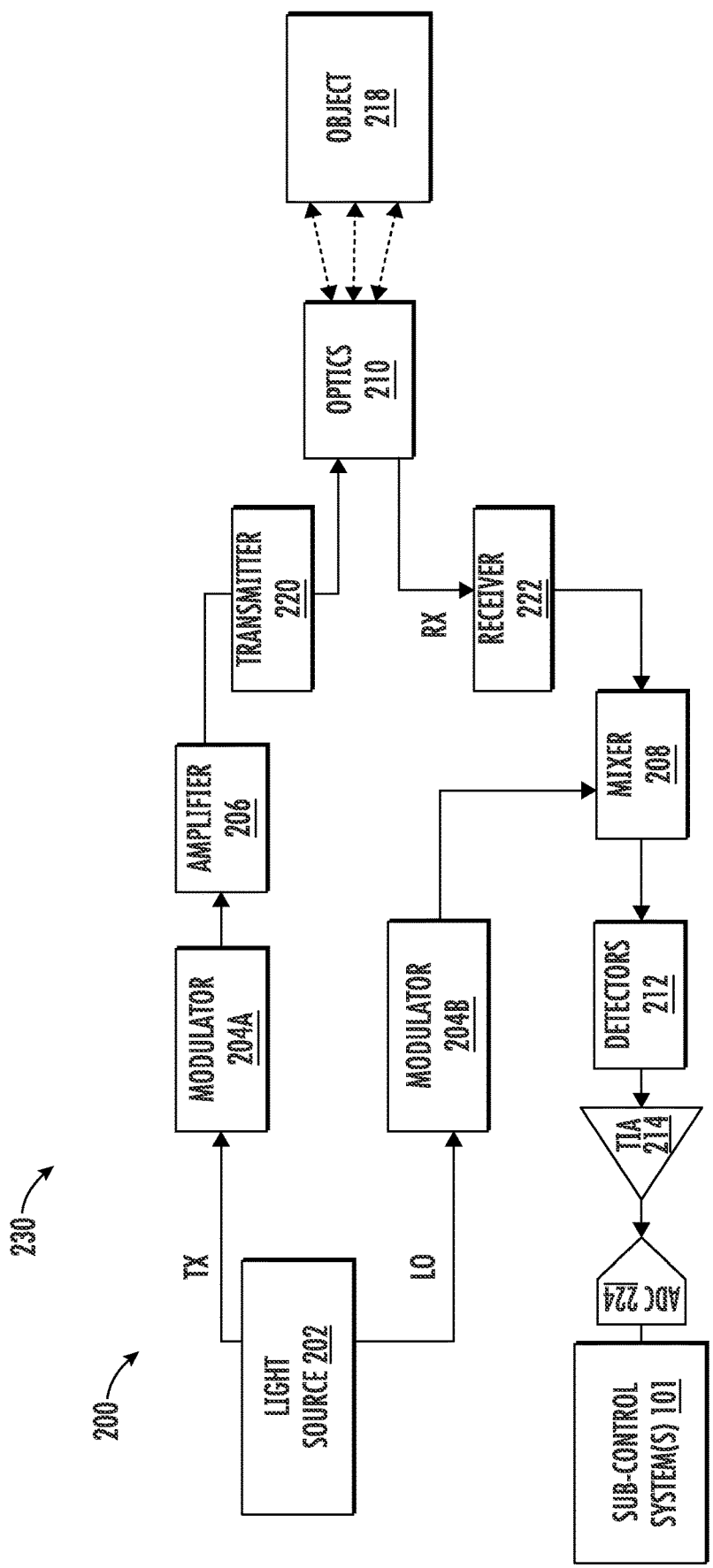
FIG. 2 depicts a block diagram of an example LIDAR system according to some implementations of the present disclosure.

FIG. 2 is a block diagram illustrating an example environment of a LIDAR sensor system for autonomous vehicles, according to some implementations. The environment includes a LIDAR system 200 that includes a transmit (Tx) path and a receive (Rx) path. The Tx path includes one or more Tx input/output ports, and the Rx path includes one or more Rx input/output ports. In some implementations, a semiconductor substrate and/or semiconductor package may include the Tx path and the Rx. In some implementations, the semiconductor substrate and/or semiconductor package may include at least one of silicon photonics circuitry, programmable logic controller (PLC), or III-V semiconductor circuitry.

In some implementations, a first semiconductor substrate and/or a first semiconductor package may include the Tx path and a second semiconductor substrate and/or a second semiconductor package may include the Rx path. In some arrangements, the Rx input/output ports and/or the Tx input/output ports may occur (or be formed/disposed/located/placed) along one or more edges of one or more semiconductor substrates and/or semiconductor packages. Components of the Rx path, the Tx path, and/or other portions of the LIDAR system 200 may be bonded by flip chip bonding as described herein.

The LIDAR system 200 includes one or more transmitters 220 and one or more receivers 222. The LIDAR system 200 further includes one or more optics 210 (e.g., an oscillatory scanner, a unidirectional scanner, a Risley prism, a circulator optic, and/or a beam collimator, etc.) that are coupled to the LIDAR system 200 (e.g., the transmitter 220 and/or receiver 222). In some implementations, the one or more optics 210 may be coupled to the Tx path via the one or more Tx input/output ports. In some implementations, the one or more optics 210 may be coupled to the Rx path via the one or more Rx input/output ports.

The LIDAR system 200 can be coupled to one or more sub-control system(s) 101 (e.g., the sub-control system(s) 101 of FIG. 1). In some implementations, the sub-control system(s) 101 may be coupled to the Rx path via the one or more Rx input/output ports. For instance, the sub-control system(s) 101 can receive LIDAR outputs from the LIDAR system 200. The sub-control system(s) 101 can control a vehicle (e.g., an autonomous vehicle) based on the LIDAR outputs.

The Tx path may include a light source 202, a modulator 204A, a modulator 204B, an amplifier 206, and one or more transmitters 220. The Rx path may include one or more receivers 222, a mixer 208, a detector 212, a transimpedance amplifier (TIA) 214, and one or more analog-to-digital converters (ADCs). Although FIG. 2 shows only a select number of components; the LIDAR system 200 may include any number of components and/or input/output channels (in any combination) that are interconnected in any arrangement to facilitate combining multiple functions of a LIDAR system, to support the operation of a vehicle.

The light source 202 may be configured to generate a light signal (or beam) that is derived from (or associated with) a local oscillator (LO) signal. In some implementations, the light source 202 may include a laser source configured to generate a laser beam. In some implementations, the light signal may have an operating wavelength that is equal to or substantially equal to 1550 nanometers. In some implementations, the light signal may have an operating wavelength that is between 1400 nanometers and 1440 nanometers.

The light source 202 may be configured to provide the light signal to the modulator 204A, which is configured to modulate a phase and/or a frequency of the light signal based on a first radio frequency (RF) signal (e.g., an "RF1" signal) to generate a modulated light signal, such as by Continuous Wave (CW) modulation or quasi-CW modulation. The modulator 204A may be configured to send the modulated light signal to the amplifier 206. The amplifier 206 may be configured to amplify the modulated light signal to generate an amplified light signal. The amplified light signal can be provided to the power distribution network 215. The power distribution network 215 can split the amplified light signal into a plurality of beams that are provided to the optics 210 via the one or more transmitters 220. The one or more transmitters 220 may include one or more optical waveguides or antennas. In some implementations, modulator 204A and/or modulator 204B may have a bandwidth between 400 megahertz (MHz) and 1000 (MHz).

The optics 210 may be configured to steer the amplified light signal(s) that it receives from the Tx path into an environment within a given field of view toward an object 218, may receive a returned signal reflected back from the object 218, and provide the returned signal to the mixer 208 of the Rx path via the one or more receivers 222. The one or more receivers 222 may include one or more optical waveguides or antennas. In some arrangements, the transmitters 220 and the receivers 222 may collectively constitute one or more transceivers. In some arrangements, the one or more transceivers may include a monostatic transceiver or a bistatic transceiver.

The light source 202 may be configured to provide the LO signal to the modulator 204B, which is configured to modulate a phase and/or a frequency of the LO signal based on a second RF signal (e.g., an "RF2" signal) to generate a modulated LO signal (e.g., using Continuous Wave (CW) modulation or quasi-CW modulation) and send the modulated LO signal to the mixer 208 of the Rx path. The mixer 208 may be configured to mix (e.g., combine, multiply, etc.) the modulated LO signal with the returned signal to generate a down-converted signal and send the down-converted signal to the detector 212.

In some arrangements, the mixer 208 may be configured to send the modulated LO signal to the detector 212. The detector 212 may be configured to generate an electrical signal based on the down-converted signal and send the electrical signal to the TIA 214. In some arrangements, the detector 212 may be configured to generate an electrical signal based on the down-converted signal and the modulated signal. The TIA 214 may be configured to amplify the electrical signal and send the amplified electrical signal to the sub-control system(s) 101 via the one or more ADCs 224. In some implementations, the TIA 214 may have a peak noise-equivalent power (NEP) that is less than 5 picowatts per square root Hertz (i.e., 5×10-12 Watts per square root Hertz). In some implementations, the TIA 214 may have a gain between 4 kiloohms and 25 kiloohms. In some implementations, detector 212 and/or TIA 214 may have a 3-decibel bandwidth between 80 kilohertz (kHz) and 450 megahertz (MHz).

The sub-control system(s) 101 may be configured to determine a distance to the object 218 and/or measure the velocity of the object 218 based on the one or more electrical signals that it receives from the TIA via the one or more ADCs 224.

Figure 3:
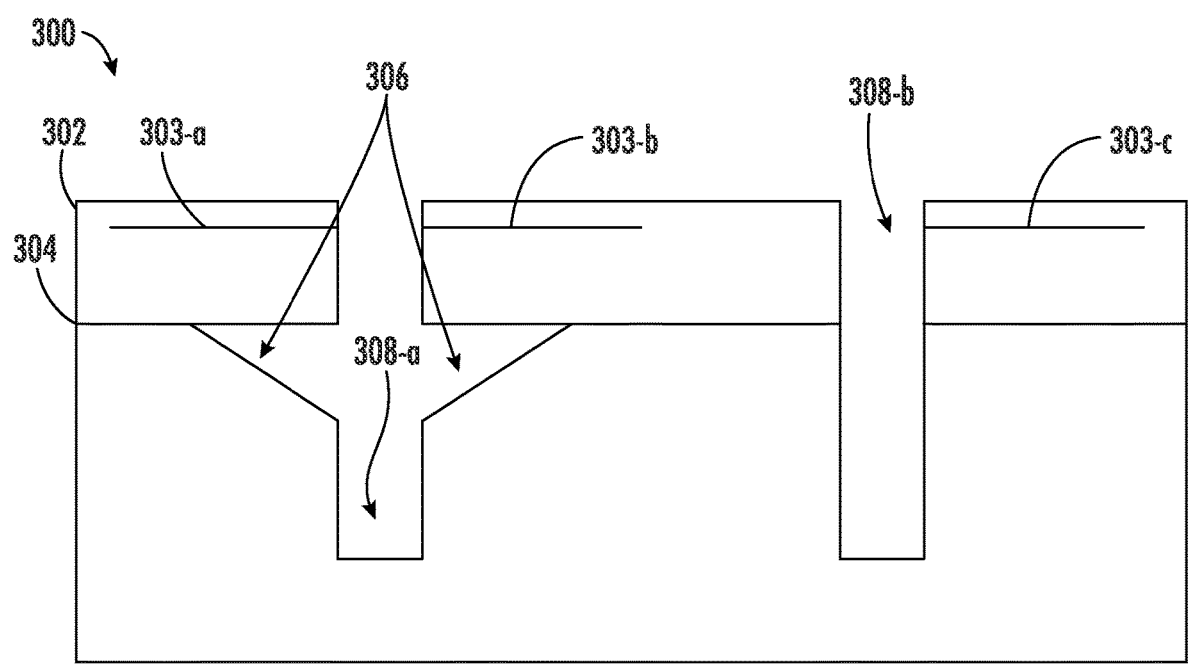
FIG. 3 depicts a diagram of an example photonics wafer according to some implementations of the present disclosure.

FIG. 3 depicts a diagram of an example photonics wafer 300 according to some implementations of the present disclosure. The photonics wafer 300 can be a substrate or wafer or portion thereof, such as a semiconductor substrate, a semiconductor wafer, a semiconductor die, or other suitable substrate including one or more semiconductor devices. The photonics wafer 300 can be formed of any suitable material. For instance, in some implementations, the photonics wafer 300 can be a silicon photonics wafer formed of silicon. As another example, in some implementations, the photonics wafer 300 can be a group III-V semiconductor die formed of a group III-V semiconductor material, such as, for example, indium phosphide (InP), gallium arsenide (GaAs), indium arsenide (InAs), gallium nitride (GaN), or indium antimonide (InSb).

The photonics wafer 300 can include one or more layers. For instance, in the example of FIG. 3, the photonics wafer 300 can include a first layer 302 and a second layer 304. The first layer 302 can be a waveguide layer including one or more waveguides 303. The waveguides 303 can propagate optical signals through the photonics wafer 300. For instance, the waveguides can form a Tx path and/or an Rx path for a LIDAR system.

The photonics wafer 300 can additionally or alternatively include one or more surface features formed in a surface of the photonics wafer 300. The surface features can be etched, ablated, or otherwise formed in the surface of the photonics die wafer. The surface features can be deep features that extend a depth into the surface of the photonics wafer 300. As used herein, a "deep feature" can have a depth of about 10% or greater of a total depth or thickness of the photonics wafer 300. For instance, in some implementations, the surface features can extend a depth of 50% or greater than the total thickness of the photonics die wafer. The surface features can form optical components (e.g., photonics circuitry) on the photonics wafer 300.

The surface features can include an undercut feature 306. The undercut feature 306 can have a maximum dimension (e.g., width) that is greater than a dimension at the surface of the photonics wafer 300. For instance, in the example of FIG. 3, the undercut feature 306 may be formed having a greater width at the intersection of the layers 302, 304 than at the surface of the layer 302. The undercut feature 306 can undercut the waveguides 303 to affect optical transmission properties of the waveguides 303. For instance, the undercut feature can be used for waveguide model size control purposes. As another example, the undercut feature 306 can decrease a loss associated with the waveguides 303. Additionally or alternatively, the surface features can include a trench feature 308. The trench feature 308 can have a substantially uniform width through the entire depth of the trench feature 308. The trench feature 308 may be used for optical butt-coupling purposes. For instance, wafer dicing can be performed along the trench feature 308 to dice the photonics wafer 300 into two or more photonics dice. In this manner, the waveguide 303 may be exposed to an edge of the photonics die such that a butt coupling can be configured between the edge of the die having the waveguide 303 and another suitable device, such as another photonics die, another optic device, or any other suitable device. Other surface features not illustrated in FIG. 3 may be included on a photonics die according to aspects of the present disclosure.

Figure 4:
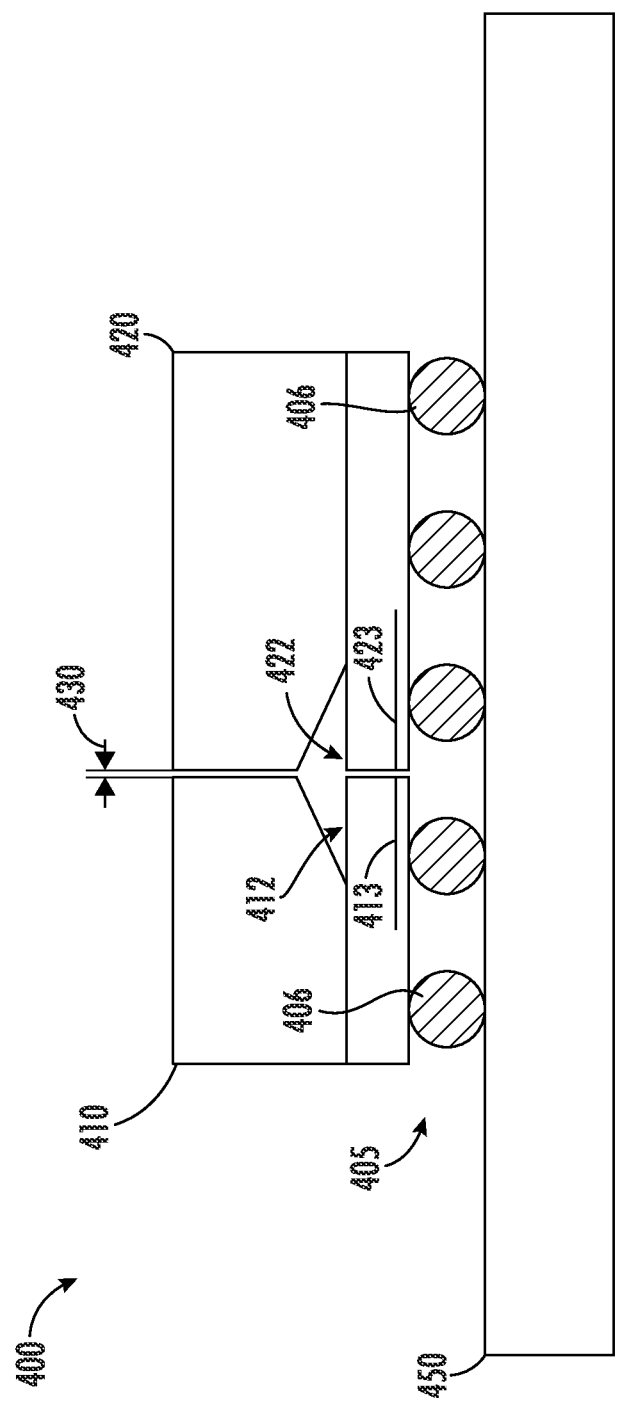
FIG. 4 depicts a diagram of an example flip chip bonding configuration according to some implementations of the present disclosure.

FIG. 4 depicts a diagram of an example flip chip bonding configuration 400 according to some implementations of the present disclosure. In the flip chip bonding configuration 400, a first photonics die 410 having an undercut feature 412 and a second photonics die 420, having a second undercut feature 422, can be bonded to a substrate 450 through one or more bump bonds 406 (e.g., solder balls). The substrate 450 can be, for example, an additional photonics die, a circuit board, or any other suitable substrate. For instance, the substrate 450 may be a circuit board of a LIDAR system. In the example of FIG. 4, the photonics dice 410, 420 can be butt coupled together through the waveguide 413 of the first photonics die 410 and the waveguide 423 of the second photonics die 420. A distance 430 between the waveguides 413 and 423 can be sufficiently small to enable transmission between the waveguides 413 and 423. For instance, the distance 430 can be any suitable distance, such as a distance of between about 100 nanometers and 10 micrometers, such as about 500 nanometers to about 5 micrometers, such as about 800 nanometers to about 2 micrometers, such as about 1 micrometer.

The photonics die 410 can be bonded to the substrate 450 by bump bond region 405. The bump bond region 405 can be formed by one or more bump bonds 406. The bump bonds 406 can be formed of solder, copper, conductive epoxy, gold, tin, lead, alloys, or other suitable bump bonding material. The bump bonds 406 can be bonded to contacts, pads, leads, or other suitable portions of the photonics die 410 and/or the substrate 450. For instance, at least some of the bump bonds 406 can be configured to transmit signals (e.g., optical signals, electrical signals) between the photonics die 410 and the substrate 450. To form the bump bonds 406, solder bumps can be formed on one or both of the photonics die 410 and the substrate 450. The photonics die and the substrate 450 can be mated (e.g., together with the application of heat, pressure, or other process) to cause the solder bumps to fuse between the photonics die and the substrate 450 and form the bump bonds 406. The bump bonds 406 can be isolated such that one bump bond 406 does not contact a second bump bond 406. To provide isolation between bump bonds 406, the bump bonds 406 may be formed with a high degree of precision. One example process for forming the bump bonds 406 on the photonics die 410 includes forming a photoresist layer on the surface of the photonics die 410, mask-selective photoresist exposure and developing, solder plating of the developed region, and removal of the remaining photoresist.

Figure 5:
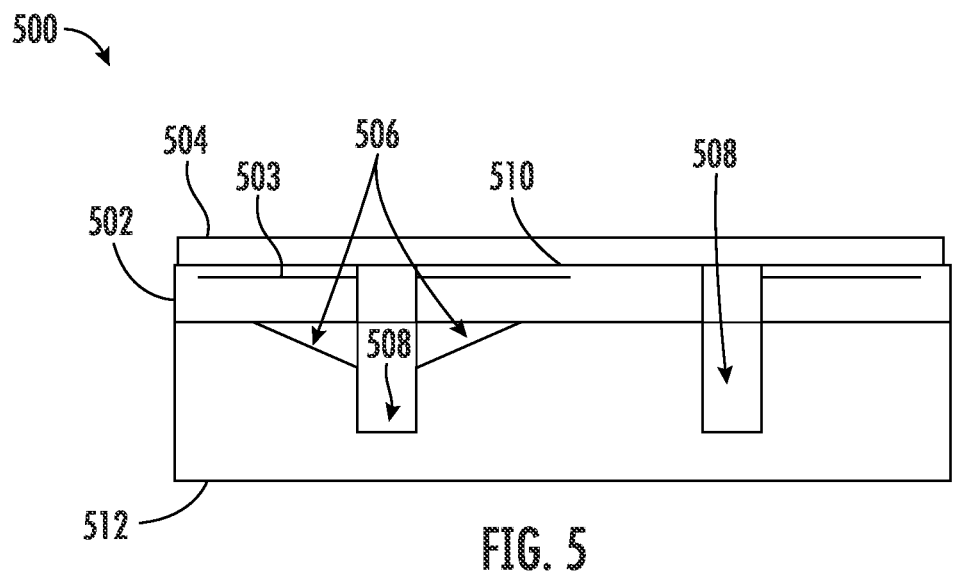
FIG. 5 depicts a diagram of an example photonics die according to some implementations of the present disclosure.

For instance, FIG. 5 depicts a diagram of at least a portion of an example photonics wafer 500 according to some implementations of the present disclosure. The photonics wafer 500 can include a first layer 502. The first layer 502 can include electrical and optical components for forming one or more electrical or optical devices in the photonics wafer 500. As examples, the first layer 502 may include one or more waveguides 503, one or more electrical or optical components such as resistors, photodiodes, capacitors, resonators, and other suitable components. In addition to the first layer 504, the photonics wafer 500 can include a second layer 512. The second layer 512 can be a silicon photonics substrate layer. The second layer 512 may not include active electrical or optical components. One or more surface features, such as undercut feature 506 and trench feature 508, can be formed extending through the first layer 502 or the second layer 512.

A photoresist layer 504 can be formed on the surface 510 of the first layer 502. The photoresist layer 504 may cover the surface features 506, 508. In some implementations, a UBM layer (not illustrated) may be formed between the surface 510 and the photoresist layer 504. The UBM layer may provide improved contact between the eventual solder bumps and the base 502 of the photonics wafer 500.

The surface 510 on which the photoresist layer 504 is formed can be a first surface. The first surface 510 can be a surface that will be bonded in a flip chip configuration (e.g. to a substrate). For instance, in some implementations, one or more waveguides 503 can be formed on the first surface 510. Additionally or alternatively, in some implementations, the first surface can include one or more signal contacts (not illustrated) for receiving bump bonds and conveying signals to components on or in the photonics wafer 500, such as components formed by the surface features 506, 508. Furthermore, in some implementations, a second surface can be opposite the first surface 510, where no signal contacts may be disposed on the second surface. For instance, the photonics wafer 500 may be entirely operational when the first surface 510 is mounted in a flip chip configuration, without requiring any additional signal contacts on the second surface. Alternatively, in some implementations, signal contacts may be included on the second surface (e.g., for wire bonding or receiving another die in a flip chip configuration).

According to example aspects of the present disclosure, the photoresist layer 504 can be a dry film photoresist layer formed of a dry film photoresist. The dry film photoresist can be laminated directly onto the surface of the first layer 502. For instance, the dry film photoresist can be a photoresist tape or other suitable laminate. The dry film photoresist may be relatively thicker than other forms of photoresist (e.g., liquid spin-coated photoresist). However, the thickness of the dry film photoresist may be sufficient for the formation of solder bumps. As one example, the photoresist layer 504 can have a thickness between about 0.1 micrometers to about 500 micrometers, such as between about 0.5 micrometers to about 200 micrometers, such as about 100 micrometers. Additionally or alternatively, the dry film photoresist can provide reduced air and/or volatile content trapped in the surface features 506, 508 by its application.

In some implementations, subsequent to applying the dry film photoresist as photoresist layer 504, the photonics wafer 500 can be exposed to an adhesion bake process at an adhesion bake temperature to improve the adhesion of the dry film photoresist layer to the surface of the base 502. The adhesion bake temperature can be any suitable temperature, such as between about 50 degrees Celsius to about 200 degrees Celsius, such as between about 60 degrees Celsius to about 150 degrees Celsius, such as between about 80 degrees Celsius to about 120 degrees Celsius, such as about 100 degrees Celsius. The adhesion bake process may be performed for an adhesion bake duration such as, for example, between about 1 minute to about 6 hours, such as between about 5 minutes to about 3 hours, such as between about 10 minutes and about 1 hour, such as less than about 10 minutes, such as greater than about 1 hour, or another suitable timeframe. The adhesion bake process may be performed such that the photonics wafer 500 is not processed further during the adhesion bake process.

Figure 6:
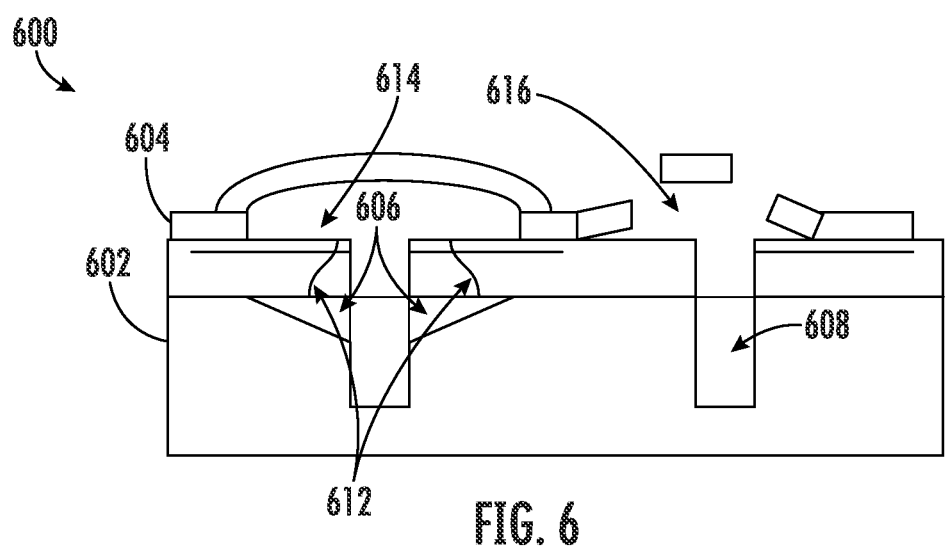
FIG. 6 depicts a diagram of an example photonics die according to some implementations of the present disclosure.

The reduced trapped air and/or volatile content provided by a dry film photoresist layer 504 can improve the formation process for bumps on a photonics die. For instance, FIG. 6 depicts a diagram of an example photonics die 600 according to some implementations of the present disclosure. Like the photonics wafer 500 of FIG. 5, the photonics die 600 includes a base 602 having an undercut feature 506 and a trench feature 508. A photoresist layer 604 is applied to the photonics die 600. The photoresist layer 604 may be a conventional photoresist layer, such as a liquid photoresist formed by spin coating. Because of the relatively higher volume of trapped air and/or volatile content in the surface features 606, 608 resulting from the conventional photoresist layer 604, a subsequent bake process (such as a bake process to harden the liquid photoresist) increasing the temperature of the photonics die 600 can cause the trapped content in the surface features 606, 608 to expand and damage the base 602 and/or the photoresist layer 604. For instance, the photoresist layer 604 can experience delamination 614 and/or breakage 616. Additionally or alternatively, the base 602 can experience breakage or damage 612, such as damage to the overhanging or suspended portions of the undercut feature 606. The damage to the photonics die 600 can result in the photonics die 600 being less efficient or unusable for intended applications such as LIDAR circuitry. However, the photoresist layer 504 of FIG. 5, formed of dry film photoresist according to example aspects of the present disclosure, can experience reduced expansion of trapped content in the surface features 506, 508 due to the reduced amount of volatile content in the dry film photoresist layer compared to other forms of photoresist such as liquid photoresist, and additionally or alternatively can be baked at a lower temperature than the liquid photoresist layer 604, providing for reduced damage to the photonics wafer 500 than the photonics die 600.

Figure 7:
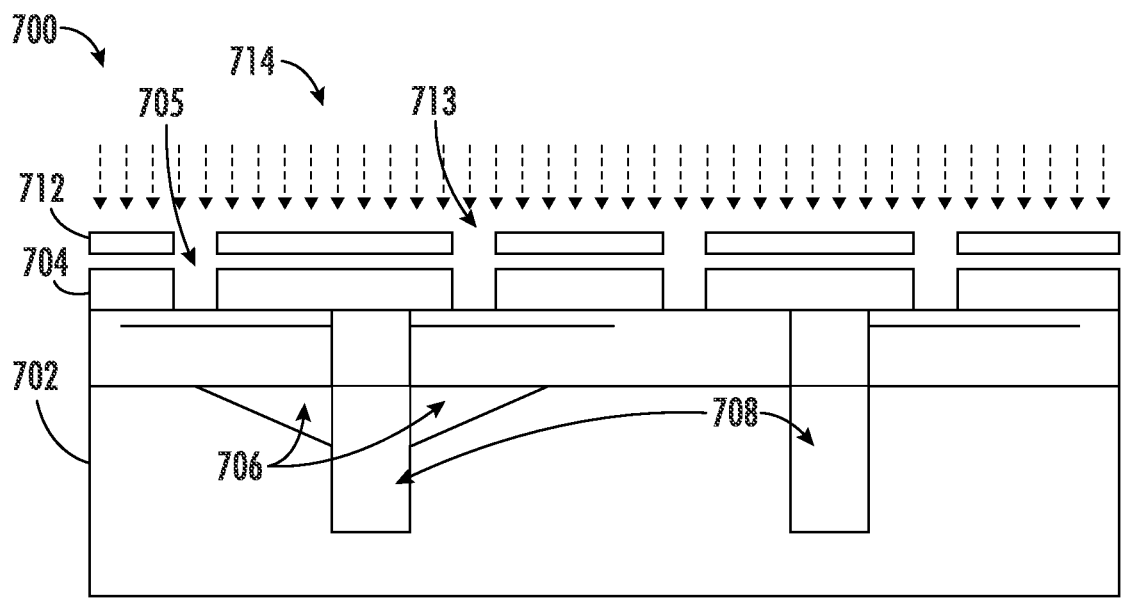
FIG. 7 depicts a diagram of an example photonics die according to some implementations of the present disclosure.

FIG. 7 depicts a diagram of an example photonics die 700 according to some implementations of the present disclosure. The photonics die 700 can be the photonics wafer 500 of FIG. 5 during and/or following a mask-selective etching and development in a photoresist layer. The photonics die 700 can include a base 702 having an undercut feature 706 and a trench feature 708. A photoresist layer 704 can be formed on a surface of the photonics die 700. The photoresist layer 704 can include one or more developed regions 705 that have been removed from the photoresist layer 704. For instance, the photoresist layer 704 can be exposed to light 714 through an opaque mask 712. The mask 712 can include one or more holes 713 that allow the light 714 to pass through the mask 712 to the photoresist layer 704. Portions of the photoresist layer 704 that are exposed to the light 714 can be degraded by exposure to the light 714, resulting in the developed regions 705. Solder bumps can be formed in the developed regions 705.

Figure 8:
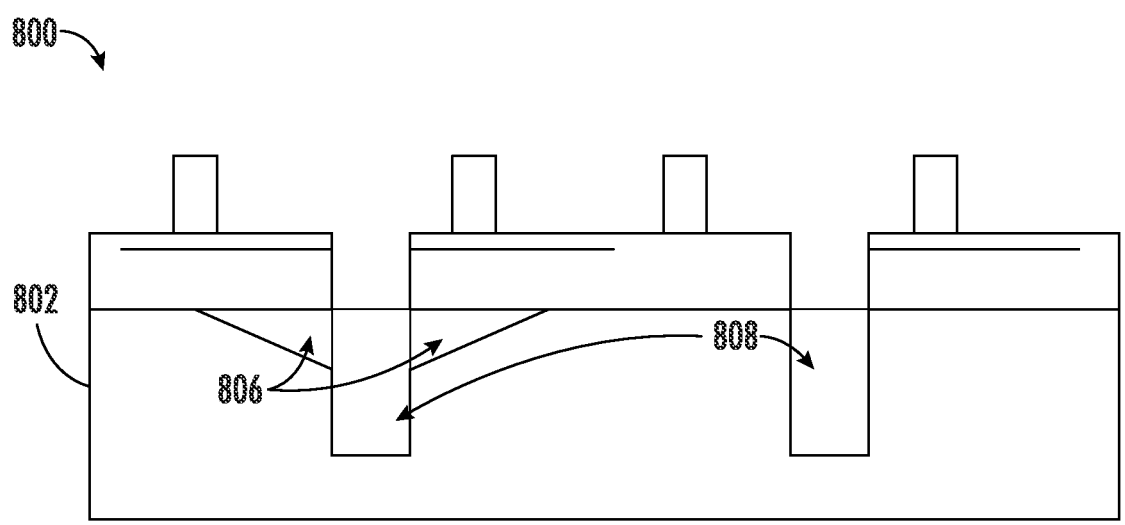
FIG. 8 depicts a diagram of an example photonics die according to some implementations of the present disclosure.

FIG. 8 depicts a diagram of an example photonics die 800 according to some implementations of the present disclosure. For instance, the example photonics die 700 can be a photonics die 700 of FIG. 7 after solder bump formation and photoresist removal. The photonics die 800 includes a base 802 having an undercut feature 806 and a trench feature 808. The photonics die 800 can additionally include one or more solder bumps 810 formed on a surface of the photonics die 800. The solder bumps 810 can be used to bump bond the photonics die 800 to a substrate or other suitable surface.

The solder bumps 810 can be formed by solder plating or deposition in developed regions (e.g., developed regions 705 of FIG. 7) of a photoresist layer (e.g., the photoresist layer 704 of FIG. 7). For instance, returning to the example of FIG. 7, when solder plating is performed on the surface of the photonics die 700, the solder may bond to the surface of the base 702 that is exposed by developed regions 705. Additionally or alternatively, the solder may not bond to the photoresist layer 704. After the photoresist layer 704 is removed (e.g., by photoresist stripping), the solder can remain on the surface of the base 702, forming the photonics die 800 of FIG. 8. In some implementations, a reflow process may be performed on the surface of the photonics die 800 to smooth the solder bumps 810.

Figure 9:
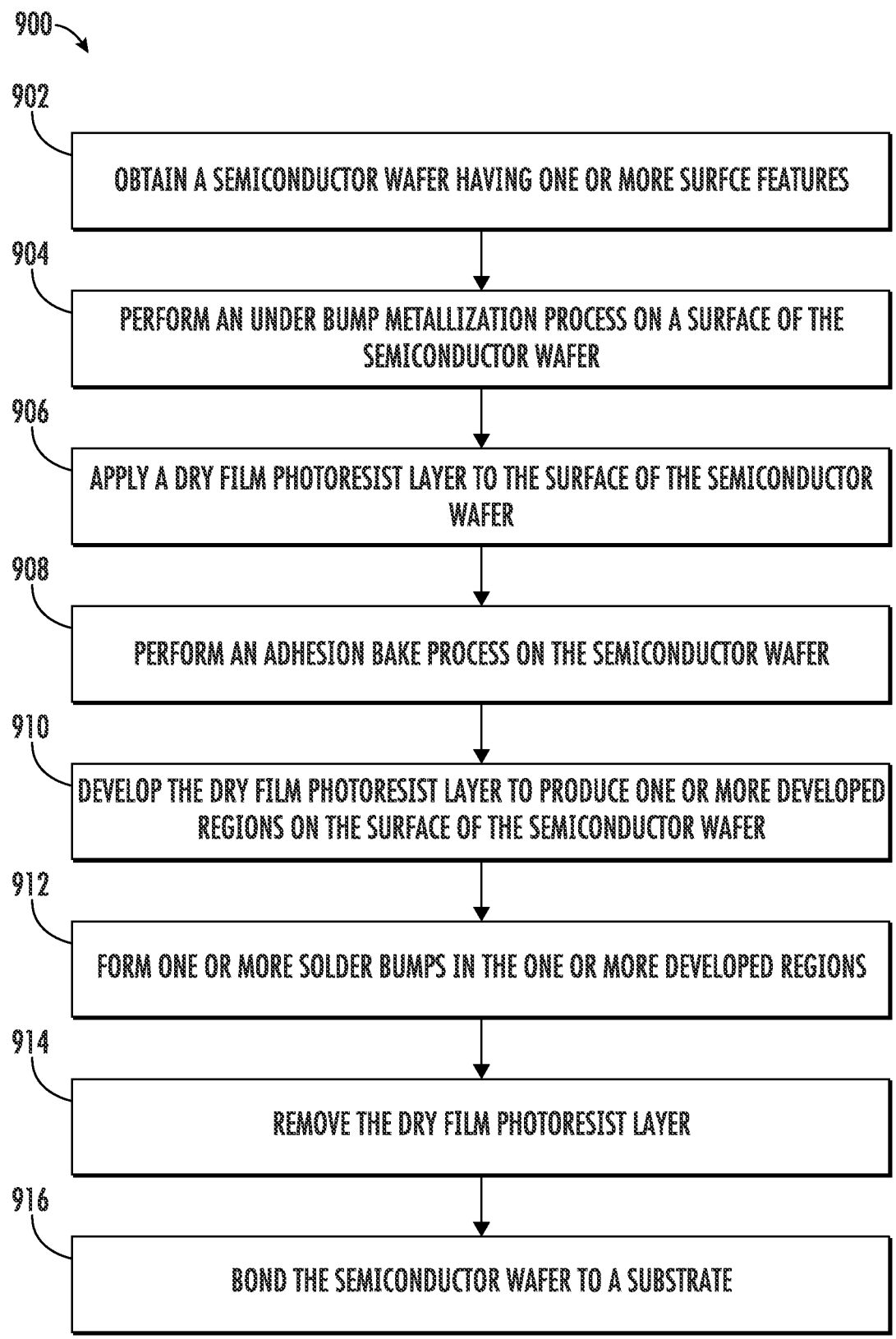
FIG. 9 depicts a flowchart diagram of an example method according to some implementations of the present disclosure.

FIG. 9 depicts a flowchart diagram of an example method 900 according to some implementations of the present disclosure. FIG. 9 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, or modified in various ways without deviating from the scope of the present disclosure.

At 902, the method 900 can include obtaining a semiconductor wafer having one or more surface features. The semiconductor wafer can be any suitable wafer, such as a semiconductor substrate, a semiconductor die, or other suitable substrate. The semiconductor wafer can be formed of any suitable material. For instance, in some implementations, the wafer can be a silicon photonics die formed of silicon. As another example, in some implementations, the wafer can be a group III-V semiconductor die formed of a group III-V semiconductor material, such as, for example, indium phosphide (InP), gallium arsenide (GaAs), indium arsenide (InAs), gallium nitride (GaN), or indium antimonide (InSb).

At 904, the method 900 can include performing an under bump metallization (UBM) process on a surface of the semiconductor wafer. The under bump metallization process can form an under bump metallization layer between the semiconductor wafer and the eventual solder bumps. The UBM layer can serve as a barrier layer to provide improved reliability and integrity of the resulting solder bumps. The UBM layer can be a relatively thin layer covering some or all of the surface of the semiconductor wafer. The UBM layer can be formed of any suitable material, such as copper, aluminum, gold, or other suitable conductive material. One example UBM process is dry vacuum sputter. Another example UBM process is electroplating. Any suitable UBM process can be used in accordance with example aspects of the present disclosure.

At 906, the method 900 can include applying a dry film photoresist layer to the surface of the semiconductor wafer. A dry film photoresist can be a photoresist in a form (e.g., a tape) that can be readily laminated onto a surface of the wafer. For instance, dry film photoresist can be laminated directly onto the surface of the wafer. For instance, the dry film photoresist can be a photoresist tape or other suitable laminate. The dry film photoresist may be relatively thicker than other forms of photoresist (e.g., liquid spin-coated photoresist). However, the thickness of the dry film photoresist may be sufficient for the formation of solder bumps. As one example, the photoresist layer can have a thickness between about 0.1 micrometers to about 500 micrometers, such as between about 0.5 micrometers to about 200 micrometers, such as about 100 micrometers. Additionally or alternatively, the dry film photoresist can provide reduced air and/or volatile content trapped in the surface features by its application.

The surface of the semiconductor wafer having the UBM layer and/or the photoresist layer can be a first surface. The first surface can be a surface that will be bonded in a flip chip configuration to a substrate. For instance, in some implementations, one or more waveguides can be formed on the first surface of the semiconductor wafer. Additionally or alternatively, in some implementations, the first surface can include one or more signal contacts for conveying signals to components on or in the semiconductor wafer. Furthermore, in some implementations, a second surface can be opposite the first surface, where no signal contacts may be disposed on the second surface. For instance, the semiconductor wafer may be entirely operational when the first surface is mounted to the substrate in a flip chip configuration, without requiring any additional signal contacts on the second surface. Alternatively, in some implementations, signal contacts may be included on the second surface.

At 908, the method 900 can include performing an adhesion bake process on the semiconductor wafer. For instance, the semiconductor wafer can be exposed to an adhesion bake process at an adhesion bake temperature to improve the adhesion of the dry film photoresist layer to the surface of the wafer. The adhesion bake temperature can be any suitable temperature, such as between about 50 degrees Celsius to about 200 degrees Celsius, such as between about 60 degrees Celsius to about 150 degrees Celsius, such as between about 80 degrees Celsius to about 120 degrees Celsius, such as about 100 degrees Celsius. The adhesion bake process may be performed for an adhesion bake duration such as, for example, between about 1 minute to about 6 hours, such as between about 5 minutes to about 3 hours, such as between about 10 minutes and about 1 hour, such as less than about 10 minutes, such as greater than about 1 hour, or another suitable timeframe. The adhesion bake process may be performed such that the wafer is not processed further during the adhesion bake process.

At 910, the method 900 can include developing the dry film photoresist layer to produce one or more developed regions on the surface of the semiconductor wafer. For instance, the photoresist layer can be exposed to light or another photoresist etchant through an opaque mask. The mask can include one or more holes that allow the light or etchant to pass through the mask to the photoresist layer. Portions of the photoresist layer that are exposed to the light or etchant can be degraded by exposure to the light/etchant, resulting in the developed regions. The mask may be patterned such that the developed regions are formed in portions of the semiconductor wafer corresponding to signal contacts, structural contacts, and/or other portions that can be contacted by solder bumps.

At 912, the method 900 can include forming one or more solder bumps in the one or more developed regions. The solder bumps can be formed by any suitable process, such as solder plating, solder paste application, evaporation, or other suitable process. The solder bumps can be formed of any suitable material, such as any suitable solder, copper, conductive epoxy, gold, tin, lead, alloys, or other suitable bump bonding material.

At 914, the method 900 can include removing the dry film photoresist layer. For instance, the remaining photoresist layer not developed to produce the developed regions can be removed after the solder bumps have been formed. The photoresist layer may be removed by etching, exposure, stripping, or any other suitable process. Additionally or alternatively, if an under bump metallization layer is present at the surface of the wafer, a UBM etch process can be performed to remove the remaining portions of the UBM layer not supporting solder bumps. After removing the dry film photoresist layer and/or UBM layer, the solder bumps may remain on the surface of the wafer.

At 916, the method 900 can include bonding the semiconductor wafer to a substrate. For instance, one or more bump bonds can be formed between the semiconductor wafer and the substrate using the solder bumps. To form the bump bonds, the wafer and the substrate can be mated (e.g., together with the application of heat, pressure, or other process) to cause the solder bumps to fuse between the photonics die and the substrate and form the bump bonds. The bump bonds can be isolated such that one bump bond does not contact a second bump bond. To provide isolation between bump bonds, the bump bonds may be formed with a high degree of precision.

Aspects of the disclosure have been described in terms of illustrative implementations thereof. Numerous other implementations, modifications, or variations within the scope and spirit of the appended claims can occur to persons of ordinary skill in the art from a review of this disclosure. Any and all features in the following claims can be combined or rearranged in any way possible. Accordingly, the scope of the present disclosure is by way of example rather than by way of limitation, and the subject disclosure does not preclude inclusion of such modifications, variations or additions to the present subject matter as would be readily apparent to one of ordinary skill in the art. Moreover, terms are described herein using lists of example elements joined by conjunctions such as "and," "or," "but," etc. It should be understood that such conjunctions are provided for explanatory purposes only. Lists joined by a particular conjunction such as "or," for example, can refer to "at least one of" or "any combination of" example elements listed therein, with "or" being understood as "and/or" unless otherwise indicated. Also, terms such as "based on" should be understood as "based at least in part on."

Those of ordinary skill in the art, using the disclosures provided herein, will understand that the elements of any of the claims, operations, or processes discussed herein can be adapted, rearranged, expanded, omitted, combined, or modified in various ways without deviating from the scope of the present disclosure. Some of the claims are described with a letter reference to a claim element for exemplary illustrated purposes and is not meant to be limiting. The letter references do not imply a particular order of operations. For instance, letter identifiers such as (a), (b), (c), . . . , (i), (ii), (iii), . . . , etc. can be used to illustrate operations. Such identifiers are provided for the ease of the reader and do not denote a particular order of steps or operations. An operation illustrated by a list identifier of (a), (i), etc. can be performed before, after, or in parallel with another operation illustrated by a list identifier of (b), (ii), etc.

The following describes the technology of this disclosure within the context of a LIDAR system and an autonomous vehicle for example purposes only. As described herein, the technology described herein is not limited to an autonomous vehicle and can be implemented for or within other systems, autonomous platforms, and other computing systems.

What is claimed is:

1. A LIDAR sensor system for a vehicle, the LIDAR sensor system comprising a silicon photonics substrate that includes:
   a semiconductor wafer;
   one or more surface features on a first surface of the semiconductor wafer, the one or more surface features comprising one or more of a trench feature and an undercut feature; and
   a photoresist layer formed on the first surface of the semiconductor wafer, the photoresist layer comprising one or more solder bumps formed in one or more developed regions of the photoresist layer,
   wherein the photoresist layer includes a laminated dry film; and wherein the one or more surface features extend a depth of at least 50% of a thickness of the semiconductor wafer into the first surface of the semiconductor wafer.

2. The LIDAR sensor system of claim 1, wherein the one or more solder bumps are configured to bond to a second substrate of the LIDAR sensor system in a flip chip configuration.

3. A LIDAR photonics substrate for a LIDAR sensor system for a vehicle, comprising:
   a semiconductor wafer;
   one or more surface features on a first surface of the semiconductor wafer, the one or more surface features comprising one or more of a trench feature and an undercut feature, wherein the one or more surface features extend a depth of at least 50% of a thickness of the semiconductor wafer into the first surface of the semiconductor wafer; and
   a photoresist layer formed on the first surface of the semiconductor wafer,
   wherein the photoresist layer includes a laminated dry film,
   wherein the substrate further comprises one or more developed regions in the laminated dry film of the photoresist layer and one or more solder bumps formed in the one or more developed regions.

4. The substrate of claim 3, wherein the one or more solder bumps are configured to bond to a substrate of a LIDAR sensor system in a flip chip configuration.

5. The substrate of claim 3, further comprising an under bump metallization (UBM) layer on the first surface of the semiconductor wafer.

6. The substrate of claim 3, further comprising a second surface opposite the first surface, wherein no signal contacts are disposed on the second surface.

7. The substrate of claim 3, wherein one or more waveguides are formed on the first surface of the semiconductor wafer.

8. The substrate of claim 3, wherein the semiconductor wafer comprises a silicon photonics wafer.

9. The substrate of claim 3, wherein the laminated dry film of the photoresist layer comprises a photoresist tape.

10. The substrate of claim 3, wherein the substrate is incorporated into a LIDAR sensor system.

11. A method of manufacturing a semiconductor wafer for a LIDAR sensor system, the method comprising:
    obtaining a semiconductor wafer having one or more surface features on a first surface of the semiconductor wafer, the one or more surface features comprising one or more of a trench feature and an undercut feature, wherein the one or more surface features extend a depth of at least 50% of a thickness of the semiconductor wafer into the first surface of the semiconductor wafer;
    applying a dry film photoresist layer to the first surface of the semiconductor wafer;
    performing an adhesion bake process on the semiconductor wafer;
    developing the dry film photoresist layer to produce one or more developed regions in the dry film photoresist layer; and
    forming one or more solder bumps in the one or more developed regions of the dry film photoresist layer.

12. The method of claim 11, further comprising performing an under bump metallization (UBM) process on the first surface of the semiconductor wafer.

13. The method of claim 11, further comprising removing the dry film photoresist layer.

14. The method of claim 11, further comprising bonding the semiconductor wafer to a substrate of a LIDAR sensor system.

15. The method of claim 11, wherein the adhesion bake process comprises heating the semiconductor wafer to an adhesion bake temperature, the adhesion bake temperature comprising a temperature between about 50 degrees Celsius and about 150 degrees Celsius.

16. The method of claim 11, wherein developing the dry film photoresist layer comprises selectively exposing the dry film photoresist layer through a patterned mask.

* * * * *